United States Patent [19]

Fukuda

[11] 4,001,721
[45] Jan. 4, 1977

[54] FIELD EFFECT TRANSISTOR MILLER INTEGRATOR OSCILLATOR WITH TEMPERATURE COMPENSATING IMPEDANCE

[75] Inventor: Minoru Fukuda, Kodaira, Japan
[73] Assignee: Hitachi, Ltd., Japan
[22] Filed: Oct. 30, 1975
[21] Appl. No.: 627,281

[30] Foreign Application Priority Data
Oct. 30, 1974 Japan .................. 49-124399

[52] U.S. Cl. .................. 331/111; 331/109; 331/176
[51] Int. Cl.² .................. H03K 3/353
[58] Field of Search ....... 331/108 R, 108 A, 108 C, 331/108 D, 109, 111, 113, 143, 176

[56] References Cited
UNITED STATES PATENTS

| | | | |
|---|---|---|---|
| 3,348,167 | 10/1967 | Gauld | 331/176 X |
| 3,851,277 | 11/1974 | Suzuki et al. | 331/108 D X |
| 3,863,179 | 1/1975 | Goo | 331/111 X |
| 3,878,482 | 4/1975 | Schowe, Jr. | 331/111 X |

*Primary Examiner*—Siegfried H. Grimm
*Attorney, Agent, or Firm*—Craig & Antonelli

[57] ABSTRACT

In an oscillation circuit wherein three or a greater odd number of inverters each of which is composed of a load FET and a driving FET are connected in cascade, a capacitor is connected between the input and output of at least one of the inverters so as to construct a Miller integrator, and the output of the final-stage inverter is connected to the input of the first-stage inverter, the improvement comprising the fact that impedance means, such as resistance, which has a positive temperature coefficient is connected in series with the capacitor, whereby the oscillation frequency of the oscillation circuit is prevented from fluctuating due to a change of the ambient temperature.

3 Claims, 4 Drawing Figures

FIELD EFFECT TRANSISTOR MILLER INTEGRATOR OSCILLATOR WITH TEMPERATURE COMPENSATING IMPEDANCE

DETAILED DESCRIPTION OF THE INVENTION

This invention relates to an oscillation circuit. More particularly, it is devoted to an oscillation circuit which is made up of insulated gate field-effect transistors (hereinbelow, termed "MISFET's" or simply "FET's").

As an oscillation circuit constituted of MISFET's, there has heretofore been proposed one as shown in FIG. 3. This circuit is so built that three inverters ($M_1$, $M_4$), ($M_2$, $M_5$) and ($M_3$, $M_6$) are connected in cascade, that a capacitor $C_o$ is externally connected between the output of the first-stage inverter and the output of the middle-stage inverter, to thereby construct a Miller integrator, and that the output of the final-stage inverter is applied to the input of the first-stage inverter.

FIG. 4 is a diagram for elucidating the operation of the circuit. Hereunder the general operation of the prior-art oscillation circuit will be explained with reference to FIGS. 3 and 4. The output point of the first-stage inverter is made a point A, while that of the middle-stage inverter is made a point B.

When the FET $M_4$ is ON and both the FET's $M_5$ and $M_6$ are OFF, the point A being the output of the first-stage inverter is at the earth level. Therefore, the capacitor $C_o$ is charged by a current from the FET $M_2$. The potential of the point B being the output of the middle-stage inverter rises with the rise of the terminal voltage of the capacitor $C_o$, and it presents a voltage waveform as shown at ① in FIG. 4. When the potential of the point B exceeds the threshold voltage $V_{th}$ of the FET $M_6$, the FET $M_6$ turns ON and hence the FET $M_4$ turns OFF, so that the potential of the point A rises up to a supply voltage $V_{DD}$. The potential of the point B correspondingly rises up to $V_{DD} + V_{th}$, and it becomes as shown at ② in FIG. 4. When, at this time, a potential exceeding the threshold voltage $V_{th}$ of the FET $M_5$ is reached owing to the rise of the potential of the point A, the FET $M_5$ turns ON. The potential of the point B, however, does not become the earth level at once. It gradually falls for the discharging period of the charges stored in the capacitor $C_o$, and presents a voltage waveform as shown at ③ in FIG. 4. Subsequently, when the charges of the capacitor $C_o$ run out, the potential of the point B becomes the earth level rapidly and presents a voltage waveform as shown at ④ in FIG. 4. Upon the arrival of the potential of the point B at the earth level, the FET $M_6$ turns OFF. The FET $M_4$ is thus turned ON, while the FET $M_5$ is turned OFF by the ON of the FET $M_4$. Consequently, the potential of the point B rises gradually, and the operation as previously stated is repeated. In this way, the circuit oscillates. The oscillation frequency is determined substantially by the time constant between the loads $M_1$, $M_2$ and the capacitor $C_o$ and the threshold voltage $V_{th}$ of the driving FET's $M_4 - M_6$.

Such circuit, however, has involved the problem that since the load FET has a temperature-dependency, the oscillation frequency varies due to a temperature change. More specifically, where the temperature rises, the mobility of the carriers of the load FET lowers, and hence, the current flowing through this FET decreases. As the result, the charging time of the capacitor $C_o$ becomes longer and the oscillation frequency becomes lower. Where the temperature drops, the progress converse to the above is followed and the oscillation frequency becomes higher.

This invention has been made in order to solve the problem described above, and it has for its object to stabilize the oscillation frequency of an oscillation circuit made up of FET's.

The fundamental construction of this invention for accomplishing the object consists in an oscillation circuit wherein a plurality of inverters each composed of an FET for a load and an FET for drive are connected in cascade, a capacitor is connected between an input and an output of at least one of said inverters to thereby construct a Miller integrator, and an output of the final-stage inverter is applied to an input of the first-stage inverter, characterized in that impedance means having a positive temperature coefficient is connected in series with said capacitor.

Hereunder this invention will be concretely explained along an embodiment with reference to the drawing.

As illustrated in the figure, the oscillation circuit according to the present invention is built as below.

Three inverters ($M_1$, $M_4$), ($M_2$, $M_5$) and ($M_3$, $M_6$) are connected in cascade, a series circuit consisting of a capacitor $C_o$ and a resistance R is externally connected between the output of the first-stage inverter and the output of the middle-stage inverter, and the output of the final-stage inverter is applied to the input of the first-stage inverter. Here, a resistance of positive temperature coefficient is used as the resistance to be externally mounted. FET's of the P channel depletion type are employed for the FET's $M_1 - M_3$ as loads, while FET's of the P channel enhancement type are employed for the FET's $M_4 - M_6$ for drive. A point A is the output point of the first-stage inverter, and a point B is the output point of the middle-stage inverter.

Figure 1:
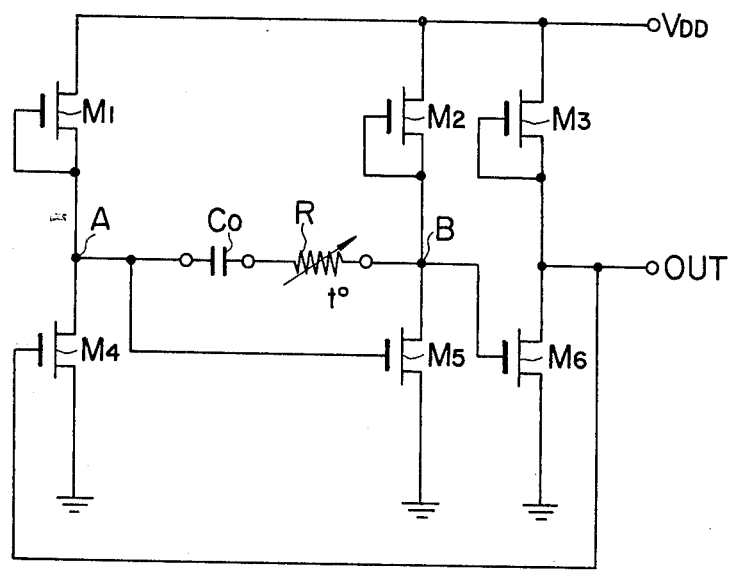
FIG. 1 is an oscillation circuit diagram showing an example of this invention.
Figure 2:
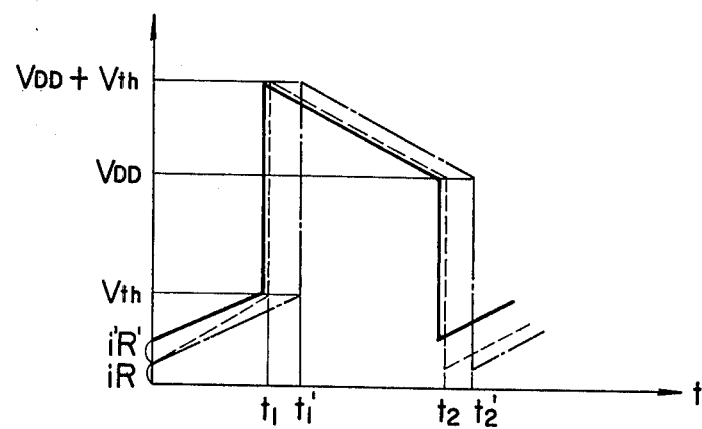
FIG. 2 is a diagram for elucidating the operation of the circuit shown in FIG. 1.
Figure 3:
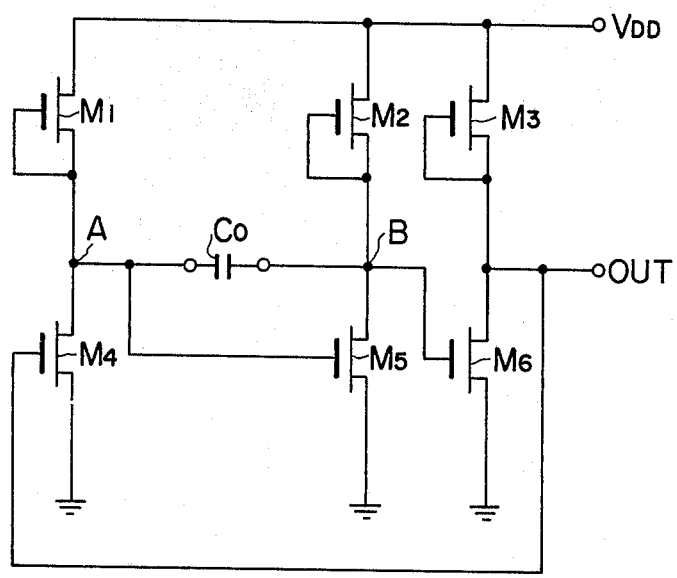
FIGS. 3 and 4 are respectively an oscillation circuit diagram previously proposed and a diagram for elucidating the operation thereof.
Figure 4:
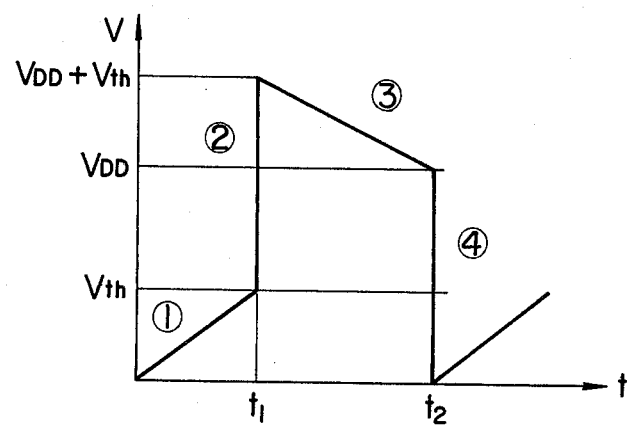

Referring to FIGS. 1 and 2, the reason why the object of this invention can be achieved will now be described.

Owing to the connection of the resistance R, the voltage waveform of the point B in this circuit becomes a dashed line in FIG. 2 which is raised by a component corresponding to a voltage drop ($i$ R).

Assuming now that the ambient temperature of the load FET has risen, the current $i$ flowing through this FET diminishes to $i'$, so that the charging time of the capacitor $C_o$ becomes longer and that the time in which the threshold voltage $V_{th}$ of each driving FET is reached becomes longer. As the result, the voltage waveform of the point B becomes inferior in inclination as illustrated by a one-dot chain line in FIG. 2. That is, the respective change points of the voltage waveform of the point B lag to $t_1'$ and $t_2'$ over the change points $t_1$ and $t_2$ at the time when no temperature change occurs. Since, however, the resistance R connected in series with the capacitor $C_o$ has the positive temperature coefficient characteristic, the value of the resistance R is also increased to $R'$ due to the rise of the ambient temperature. Accordingly, the potential of the point B becomes higher by the component of the voltage drop $i'$ $R'$, and the voltage waveform is corrected as illustrated by a full line in FIG. 2. The change points of this waveform become the points of time $t_1$ and $t_2$ substantially as usual. In this manner, the stabilization of the frequency can be attained. Here, the load FET of the depletion type has a constant current characteristic. It therefore causes a constant current to flow irrespective of the change of the resistance value, so that the change of the resistance value appears as the change of the voltage of the point B immediately.

Conversely, when the ambient temperature lowers, the current flowing through the load FET augments, and the frequency is directed to heighten. The resistance R, however, decreases in value and acts so as to lower the potential of the point B and to lower the frequency. For this reason, the stabilization of the frequency can be attained.

The embodiment has been explained as employing the externally attached resistance for the impedance means. This invention, however, is not restricted thereto, but the effect will be still greater if the resistance is disposed within a semiconductor integrated circuit (IC). In addition, the impedance means is not restricted to the resistance, but any means exhibiting the positive temperature coefficient characteristic may be adopted.

Moreover, the number of the inverters constituting the oscillation circuit is not restricted to three, but it may also be any odd number greater than three.

Further, the load constituting the inverter is not restricted to the FET of the depletion type, but any load exhibiting the constant current characteristic may be adopted.

This invention can be extensively utilized for the oscillation circuit in which the Miller integrator is connected to the inverter.

What is claimed is:

1. In an oscillation circuit wherein a plurality of inverters each composed of an FET for a load and an FET for drive are connected in cascade, a capacitor is connected between an input and an output of at least one of said inverters to thereby construct a Miller integrator, and an output of the final-stage inverter is applied to an input of the first-stage inverter, an oscillation circuit characterized in that impedance means having a positive temperature coefficient is connected in series with said capacitor.

2. An oscillation circuit according to claim 1, wherein said load FET's are of depletion type and said drive FET's are of enhancement type.

3. An oscillation circuit according to claim 2, wherein the output of the last stage of said inverter is directly connected to the gate electrode of said drive FET in the first stage of said inverter.

* * * * *